United States Patent
Tu et al.

[11] Patent Number: 6,037,251
[45] Date of Patent: Mar. 14, 2000

[54] PROCESS FOR INTERMETAL SOG/SOP DIELECTRIC PLANARIZATION

[75] Inventors: Tuby Tu, Miali; Chin-Ta Wu, ChangHua; Chen Kuang-Chao, Hsinchu; Dinos Huang, KaoHsiung, all of Taiwan

[73] Assignee: Mosel Vitelic Inc., Hsinchu, Taiwan

[21] Appl. No.: 09/003,153

[22] Filed: Jan. 6, 1998

[30] Foreign Application Priority Data

Nov. 21, 1997 [TW] Taiwan ................................. 86117467

[51] Int. Cl.⁷ ............................................. H01L 21/4763
[52] U.S. Cl. ..................... 438/626; 438/631; 438/624; 438/645; 438/697; 438/699; 438/734
[58] Field of Search ........................... 438/626, 631, 438/645, 697, 699, 734, 743, 756, 689, 694

[56] References Cited

U.S. PATENT DOCUMENTS

| | | | |
|---|---|---|---|
| 5,068,207 | 11/1991 | Yu | 437/231 |
| 5,350,486 | 9/1994 | Huang | 156/633 |
| 5,393,708 | 2/1995 | Hsia et al. | 437/228 |
| 5,503,882 | 4/1996 | Dawson | 427/579 |
| 5,552,346 | 9/1996 | Huang et al. | 437/228 |
| 5,569,618 | 10/1996 | Matsubara | 437/52 |
| 5,631,197 | 5/1997 | Yu et al. | 438/699 |
| 5,814,377 | 9/1998 | Robles et al. | 427/579 |
| 5,869,394 | 2/1999 | Chen et al. | 438/624 |
| 5,936,307 | 8/1999 | Schonauer et al. | 257/764 |

OTHER PUBLICATIONS

S. Wolf, Silicon Processing for the VLSI Era, vol. 1—Process Technology, Lattice Press, 1990.

*Primary Examiner*—John F. Niebling
*Assistant Examiner*—Viktor Simkovic
*Attorney, Agent, or Firm*—Bacon & Thomas

[57] ABSTRACT

A process for intermetal SOG/SOP dielectric planarization without having effect is described. First, a silicon-rich oxide (SRO) layer is formed on a substrate surface. Next, a metal layer and an antireflective coating (ARC) layer are sequentially deposited over the SRO layer. The metal layer and ARC layer are then etched to define metal patterns by the conventional lithography and etching techniques. Next, an Ozone-TEOS ($O_3$-TEOS) layer and a SOG layer are then formed over the entire substrate surface. Next, the $O_3$-TEOS layer and SOG layer are subjected to etching back treatment to obtain a planar substrate surface which only has a small portion of the $O_3$-TEOS layer covered on the substrate surface. The etching back treatment can be PEB, TEB or CMP techniques. Finally, a passivation layer is deposited over the remaining of $O_3$-TEOS layer.

20 Claims, 3 Drawing Sheets

PROCESS FOR INTERMETAL SOG/SOP DIELECTRIC PLANARIZATION

BACKGROUND OF THE INVENTION (1) Field of the Invention

This invention relates generally to the field of integrated circuits fabrication, and more particularly, to a process of forming spin-on-glass (SOG) layer on a metal pattern to improve the surface planarization of the integrated circuits.

(2) Description of the Prior Art

In order to form compact and high density devices, multiple layers of conductors and insulators are stacked within the limited area in IC fabrication. It tends to have steep and complicated topography on the wafer surfaces. The mentioned scenario can be more caustic in the process of dynamic random access memory (DRAM) because the alternating multi-layers of polysilicon and dielectric layers are deposited and etched to form the capacitors. These complicated topography on wafer surfaces has severe negative effect on subsequent processes. It will diminish the range of depth of focus during lithography exposure especially and distort the photoresist profiles or even cause residue during etching, and it may produce undesired metal lines shorting. The planarization technologies of so-called "biased sputter oxide deposition" or "oxide reflow" are currently employed to solve the topography problem, however they are both time consuming and costly. U.S. Pat. No. 5,393,708 to Hsia et al. (the entire disclosure of which is herein incorporated by reference) describes another simple and low cost technique which is used spin-on-glass (SOG) for planarization as the dielectric interlayer material between two metal layers. SOGs often called organic silicates (a type of silicon dioxide), are applied in liquid form across the entire silicon wafer surface by spinning in the same manner as photoresist. The liquid silicate is then heated to convert it into a silica film. The liquid silicate easily flows into any dimensional valley at the upper surface of the silicon substrate to fill and thereby obtain planar topography. Therefore, SOG becomes most widely used planarization material for today's semiconductor industry. Common SOG materials include silicates or siloxane mixed in alcohol or ketone based solvents. Siloxane-based SOG materials have organic methyl ($CH_3$) or phenyl ($C_6H_5$) groups added to improve cracking resistance. However, non etching back (NEB) SOG planarization process suffers poison via due to outgassing from damaged SOG by $O_2$ plasma treatment to strip photoresist layer. Therefore, partial etching back (PEB) or total etching back (TEB) become more popular techniques because of less SOG remained on metal pattern surface.

Referring now to FIGS. 1(a) to 1(c), there are cross sectional representations of the conventional SOG etching back process. First, metal patterns 3 which are composed of aluminum alloys 31 and titanium nitride (TiN) antireflective layer 32 are defined on a semiconductor substrate 1. Next, a liner 5 is deposited on the entire substrate surface. A SOG layer 7 is then directly coated over the liner 5 as shown in Fig. 1(a). In order to achieve more stable via RC time constant, PEB or TEB is performed to reduce the overall thickness of the SOG layer as shown in FIG. 1(b). However, due to nonuniform SOG thickness (center portion 7a is thicker than edges 7b), overetch is necessary to completely remove entire SOG layer. That causes so-called metal corner clipping as shown in FIG. 1(c) which undesirably increases the resistance of the metal patterns. Therefore, it degrades the performance and reliability of the integrated circuits.

This invention reveals an improved process of intermetal dielectric planarization, particularly for solving the SOG edge thinning problem.

SUMMARY OF THE INVENTION

Accordingly, it is a primary object of the present invention to provide a process for intermetal SOG/SOP dielectric planarization in an integrated circuit.

It is another object of the present invention to provide a process for intermetal SOG/SOP dielectric planarization by using $O_3$-TEOS underlayer to obtain uniform SOG thickness and therefore eliminate thinning problem.

Yet, another object of the present invention is to provide a process for intermetal SOG/SOP dielectric planarization to achieve excellent gap filling capability of the SOG layer in an integrated circuit.

It is a further object of the present invention to provide a process for intermetal SOG/SOP dielectric planarization which gains better planarization control ability without undesired voids formation.

These objects are accomplished by the fabrication process described below.

First, a silicon-rich oxide (SRO) layer is formed on a substrate surface. Next, a metal layer and an antireflective coating (ARC) layer are sequentially deposited over the SRO layer. The metal layer and ARC layer are then patterned to define metal patterns by the conventional lithography and etching techniques. Next, a Tetra-Ethyl-Ortho Silicate layer grown in an Ozone environment ($O_3$-TEOS) and a SOG layer are then formed over the entire substrate surface. Next, the $O_3$-TEOS layer and SOG layer are subjected to etching back treatment to obtain a planar substrate surface which only has a small portion of the $O_3$-TEOS layer covered on the substrate surface. The etching back treatment can be PEB, TEB or CMP techniques. This step is one of the key points of the present invention, there is no more SOG remained on the metal pattern surface, besides, a very good gap filling capability can be achieved for the selective $O_3$-TEOS process that can effectively eliminate the SOG thinning problem of the conventional planarization process. Finally, a passivation layer is deposited over the remaining of $O_3$-TEOS layer. The process for intermetal SOG/SOP dielectric planarization without thinning effect according to the present invention is accomplished.

BRIEF DESCRIPTION OF THE DRAWINGS

The accompanying drawings forming a material part of this description, in which.

DESCRIPTION OF THE PREFERRED EMBODIMENTS

Figure 1A:
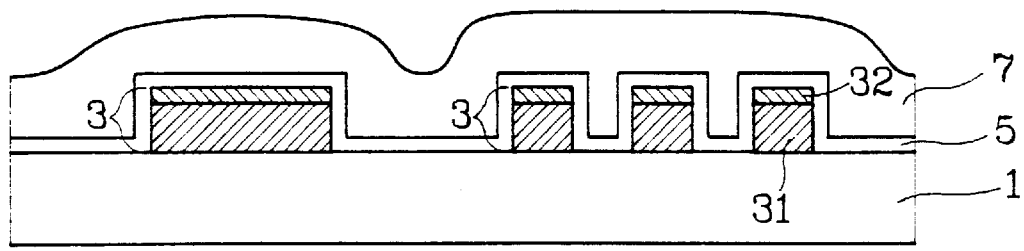
FIGS. 1(a) to 1(c) show cross sectional representations of the conventional SOG planarization process.
Figure 1B:
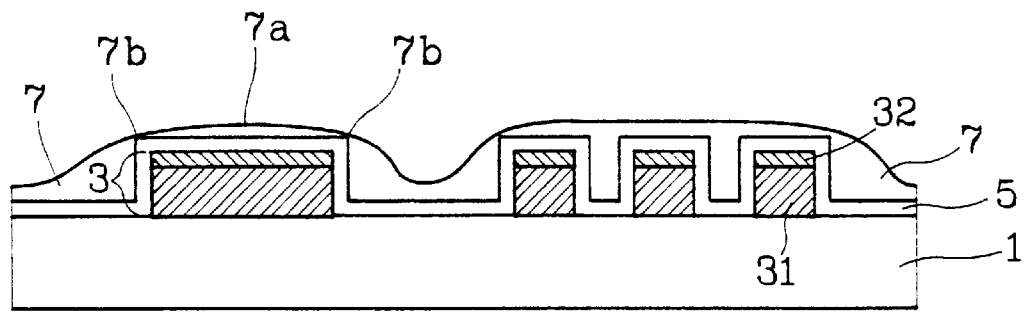
Figure 1C:
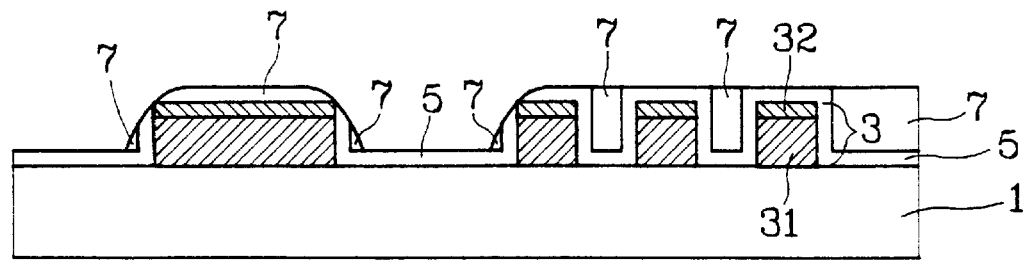

The invention discloses herein is directed to a process for intermetal SOG/SOP dielectric planarization without thinning effect. The drawing figures are illustrated a partially completed silicon substrate. In the following description, numerous details are set forth in order to provide a thorough understanding of the present invention. It will be appreciated by one skilled in the art that variations of these specific details are possible while still achieving the results of the present invention. In other instance, well-known processing steps are not described in detail in order not to unnecessarily obscure the present invention.

First Embodiment of the Invention

Figure 2:
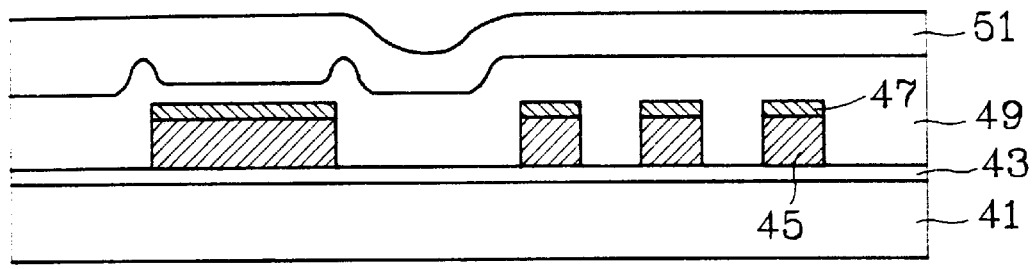
FIG. 2 shows a cross sectional representation of a substrate after the $O_3$-TEOS layer and SOG layer are formed according to the first embodiment of the present invention.

Referring now more particularly to FIG. 2, a silicon-rich oxide (SRO) layer 43 is formed on a substrate 41 surface. Next, a metal layer 45 and an antireflective coating (ARC) layer 47 are sequentially deposited over the SRO layer 43. The metal layer 45 and ARC layer 47 are then patterned to define metal patterns by the conventional lithography and etching techniques. Next, an Ozone-TEOS ($O_3$-TEOS) layer 49 and a SOG layer 51 are then formed over the entire substrate 41 surface as shown in FIG. 2. Please note that there are always bumps on the edges when $O_3$-TEOS covered on the surface of the metal patterns.

The substrate 41 is typically using semiconductor wafer composed of silicon or gallium arsenide (GaAs). Alternatively, glass flat panel for liquid crystal display (LCD) or ceramic substrate may also be used. The SRO layer 43 is usually using plasma enhanced chemical vapor deposited (PECVD) silane (PE-SiH). Alternatively, the SRO layer 43 can be plasma enhanced chemical vapor deposited TEOS (PE-TEOS). The metal layer 45 is usually aluminum alloys such as aluminum (Al), aluminum copper (AlCu) or aluminum silicon copper (AlSiCu). Alternatively, polysilicon or polycide which is employed as gate electrodes or interconnection lines can also work. The thickness of the metal layer is about 4000 to 12000 Angstroms. The ARC layer 47 which is typically a metal composed of titanium is selecting from the group consisting of chemical vapor deposited titanium nitride (CVD TiN), physical vapor deposited titanium nitride (PVD TiN), titanium (Ti) and titanium tungsten (TiW). The metal layer 45 and ARC layer 47 etching process is using dry etching technique such as magnetic enhanced reactive ion etching (MERIE), electron cyclotron etching (ECR) or reactive ion etching (RIE) methods.

The $O_3$-TEOS layer 49 is typically formed by atmosphere chemical vapor deposition (APCVD) or sub-atmosphere CVD (SACVD) techniques, the deposition operation is under a mixture of ozone and TEOS gases, at a temperature range of 300° C. to 600° C., a pressure range of 300 to 760 Torr, with ozone flow rate of 3500 to 5500 sccm and TEOS flow rate of 200 to 400 mg/min. The SOG layer 51 can be silicate, siloxane or any types of glass. Even a photoresist layer may also be employed. After SOG is coated on the $O_3$-TEOS layer, a high-temperature curing step is performed at a temperature about 400° C. to form Si-O bonds.

Figure 3:
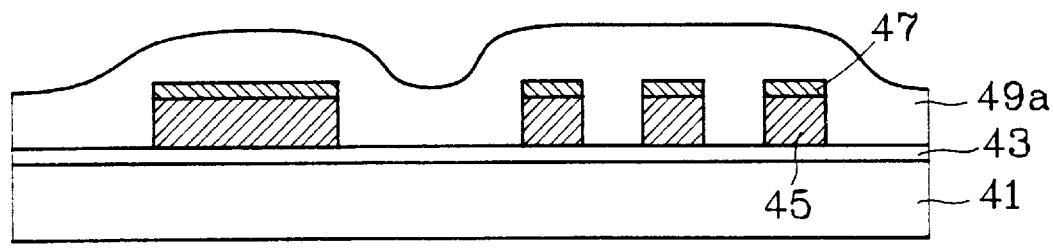
FIG. 3 shows a cross sectional representation of a substrate after the $O_3$-TEOS layer and SOG layer are etched back according to the first embodiment of the present invention.

Referring now to FIG. 3, the $O_3$-TEOS layer 49 and SOG layer 51 are subjected to etching back treatment to obtain a planar substrate surface which only has a portion of the $O_3$-TEOS layer 49 covered on the substrate surface. The etching back treatment can be PEB, TEB or CMP techniques. This step is one of the key points of the present invention, there is no more SOG remained on the metal pattern surface, besides, a very good gap filling capability can be achieved for the selective $O_3$-TEOS process that can effectively eliminate the SOG thinning problem of the conventional planarization process.

Figure 4:
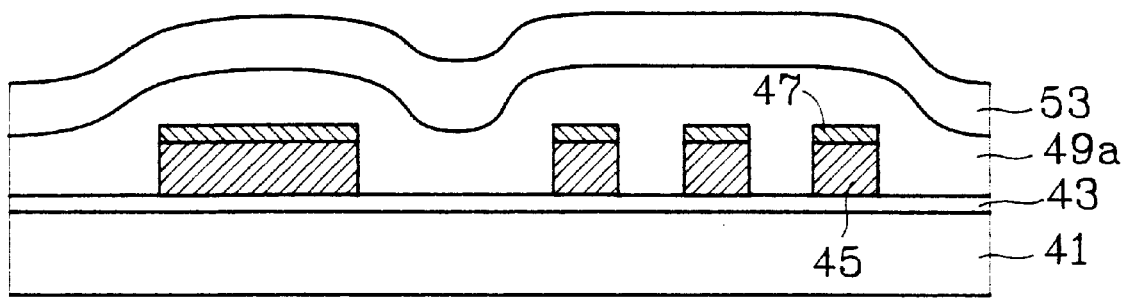
FIG. 4 shows a cross sectional representation of a substrate after the passivation layer is formed according to the first embodiment of the present invention.

Referring now to FIG. 4, finally, a passivation layer 53 is deposited over the remaining of $O_3$-TEOS layer to a thickness of about 2000 to 12000 Angstroms. The process for intermetal SOG/SOP dielectric planarization without thinning effect according to the present invention is accomplished. The passivation layer 53 is usually using PE-TEOS, alternatively, other types of oxide, nitride ($Si_3N_4$) or oxynitride ($SiO_xN_y$) can also be used.

Second Embodiment of the Invention

Figure 5:
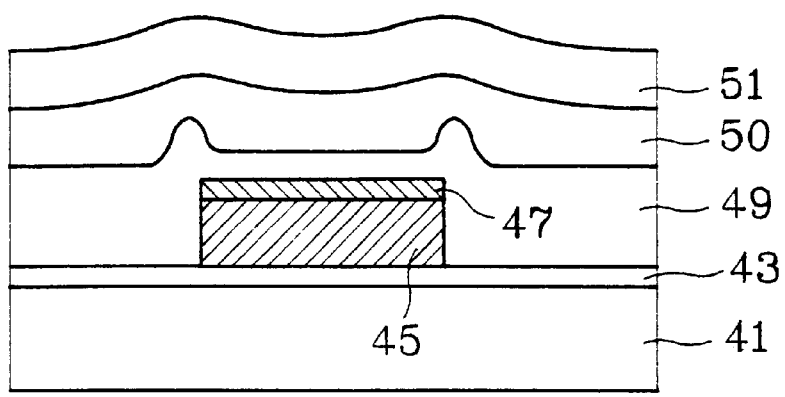
FIG. 5 shows a cross sectional representation of a substrate after the $O_3$-TEOS layer, PE-TEOS layer and SOG layer are formed according to the second embodiment of the present invention.

Alternatively, FIGS. 3, 4, and 5 illustrate another preferred embodiment of the present invention. The same reference numbers represent the same elements of the previous embodiment.

Referring now to FIG. 5, a SRO layer 43 is first formed on a substrate 41 surface as described before. Next, a metal layer 45 and an antireflective coating (ARC) layer 47 are sequentially deposited over the SRO layer 43. The metal layer 45 and ARC layer 47 are then patterned to define metal patterns by the conventional lithography and etching techniques. Next, an $O_3$-TEOS layer 49, a dielectric layer 50 and a SOG layer 51 are then formed over the entire substrate 41 surface as shown in FIG. 5. Since the $O_3$-TEOS deposition rate is much slower when $O_3$-TEOS layer 49 grows on a metal pattern with larger dimensions, for example bonding pads, an extra dielectric layer 50 is necessary to achieve better planarization results. Therefore, the total thickness on the substrate is ideally to perform sequential etching back treatment. The dielectric layer 50 is usually using PE-TEOS, alternatively, other types of oxide, nitride ($Si_3N_4$) or oxynitride ($SiO_xN_y$) can also be used.

The remaining process steps still follow the same steps of the first embodiment as shown in FIGS. 3 and 4.

While the invention has been particularly shown and described with reference to a preferred embodiment, it will be understood by those skilled in the art that various changes in form and detail may be made therein without departing from the spirit and scope of the present invention.

What is claimed is:

1. A method of intermetal dielectric planarization, comprising the steps of:
   (a) forming a silicon-rich oxide layer on a substrate;
   (b) sequentially forming a metal and an antireflective coating (ARC) layer overlaying said silicon-rich oxide layer, wherein said ARC layer is composed of titanium;
   (c) partially etching said ARC and metal layers to define metal patterns;
   (d) sequentially forming an ozone-TEOS ($O_3$-TEOS) layer in an environment with an ozone flow rate of 3500 to 5500 sccm and a TEOS flow rate of 200 to 400 mg/min to form bumps on the edges of the metal patterns; and a spin-on-glass (SOG) layer over the entire substrate surface;
   (e) etching back said SOG and $O_3$-TEOS layers to obtain a planar substrate surface; and
   (f) forming a passivation layer.

2. The method of claim 1, wherein said substrate is selected from the group consisting of glass panel, ceramic substrate, silicon wafer and gallium arsenide (GaAs) wafer.

3. The method of claim 1, wherein said silicon-rich oxide layer is selected from the group consisting of plasma enhanced chemical vapor deposited silane (PE-SiH$_4$) and tetra-ethyl-ortho silicate (PE-TEOS).

4. The method of claim 1, wherein said metal layer is an alloy selected from the group consisting of aluminum (Al), aluminum copper (AlCu) and aluminum silicon copper (AlSiCu).

5. The method of claim 1, wherein said metal layer is an alloy selected from the group consisting of polysilicon and polycide.

6. The method of claim 1, wherein said ARC layer composed of titanium is selected from the group consisting of chemical vapor deposited titanium nitride (CVD TiN), physical vapor deposited titanium nitride (PVD TiN), titanium (Ti) and titanium tungsten (TiW).

7. The method of claim 1, wherein said SOG layer is selected form the group consisting of silicate and siloxane.

8. A method of intermetal dielectric planarization, comprising the steps of:
    (a) forming a silicon-rich oxide layer on a substrate;
    (b) sequentially forming a metal and an ARC layer overlaying said silicon-rich oxide layer, wherein said ARC layer is composed of titanium;
    (c) partially etching said ARC and metal layers to define metal patterns;
    (d) sequentially forming an $O_3$-TEOS layer, a PE-TEOS layer and a SOG layer over the entire substrate surface, wherein said $O_3$-TEOS layer formed in an environment with an ozone flow rate of 3500 to 5500 sccm and a TEOS flow rate of 200 to 400 mg/min to form bumps on the edges of the metal patterns;
    (e) etching back said SOG, PE-TEOS, and $O_3$-TEOS layers to obtain a planar substrate surface; and
    (f) forming a passivation layer.

9. The method of claim 8, wherein said substrate is selected from the group consisting of glass panel, ceramic substrate, silicon wafer and GaAs wafer.

10. The method of claim 8, wherein said silicon-rich oxide layer is selected from the group consisting of PE-$SiH_4$ and PE-TEOS.

11. The method of claim 8, wherein said metal layer is an alloy selected from the group consisting of Al, AlCu and AlSiCu.

12. The method of claim 8, wherein said metal layer is an alloy selected from the group consisting of polysilicon and polycide.

13. The method of claim 8, wherein said ARC layer composed of titanium is selecting from the group consisting of CVD TiN, PVD TiN, Ti and TiW.

14. The method of claim 8, wherein said SOG layer is selected form the group consisting of silicate and siloxane.

15. A method of eliminating an intermetal photoresist thinning problem, comprising the steps of:
    (a) forming a silicon-rich oxide layer on a substrate;
    (b) sequentially forming a metal and an ARC layer overlaying said silicon-rich oxide layer, wherein said ARC layer is composed of titanium;
    (c) partially etching said ARC and metal layers to define metal patterns;
    (d) forming an $O_3$-TEOS layer in an environment with an ozone flow rate of 3500 to 5500 sccm and a TEOS flow rate of 200 to 400 mg/min to form bumps on the edges of the metal patterns and over the entire substrate surface; and
    (e) coating a photoresist layer overlaying said $O_3$-TEOS layer.

16. The method of claim 15, wherein said substrate is selected from the group consisting of glass panel, ceramic substrate, silicon wafer and GaAs wafer.

17. The method of claim 15, wherein said silicon-rich oxide layer is selected from the group consisting of PE-$SiH_4$ and PE-TEOS.

18. The method of claim 15, wherein said metal layer is an alloy selected from the group consisting of Al, AlCu and AlSiCu.

19. The method of claim 15, wherein said metal layer is an alloy selected from the group consisting of polysilicon and polycide.

20. The method of claim 15, wherein said ARC layer composed of titanium is selected from the group consisting of CVD TiN, PVD TiN, Ti and TiW.

* * * * *